US009476717B2

(12) United States Patent
Haverinen et al.

(10) Patent No.: US 9,476,717 B2
(45) Date of Patent: Oct. 25, 2016

(54) SIMULTANEOUS LOCALIZATION AND MAPPING BY USING EARTH'S MAGNETIC FIELDS

(71) Applicant: INDOORATLAS OY, Oulu (FI)

(72) Inventors: Janne Haverinen, Kiviniemi (FI); Esa Rahtu, Oulu (FI)

(73) Assignee: INDOORATLAS OY, Oulu (FI)

( * ) Notice: Subject to any disclaimer, the term of this patent is extended or adjusted under 35 U.S.C. 154(b) by 68 days.

(21) Appl. No.: 14/524,420

(22) Filed: Oct. 27, 2014

(65) Prior Publication Data

US 2016/0116290 A1 Apr. 28, 2016

(51) Int. Cl.
G01C 21/08 (2006.01)
H04W 64/00 (2009.01)
G01V 3/08 (2006.01)
G01C 21/20 (2006.01)
G01V 7/00 (2006.01)
G01R 33/10 (2006.01)
G01C 21/14 (2006.01)
G01C 21/16 (2006.01)
G01S 5/02 (2010.01)
G01S 5/16 (2006.01)
G01V 3/40 (2006.01)

(52) U.S. Cl.
CPC ............ *G01C 21/206* (2013.01); *G01C 21/08* (2013.01); *G01C 21/14* (2013.01); *G01C 21/165* (2013.01); *G01R 33/10* (2013.01); *G01S 5/0221* (2013.01); *G01S 5/0252* (2013.01); *G01S 5/0263* (2013.01); *G01S 5/16* (2013.01); *G01V 3/40* (2013.01); *G01V 7/00* (2013.01); *H04W 64/00* (2013.01)

(58) Field of Classification Search
CPC .... G01C 21/206; G01C 21/14; G01C 21/16; G01C 21/08; G01V 7/00; H04W 4/04; G01R 33/10
See application file for complete search history.

(56) References Cited

U.S. PATENT DOCUMENTS

| 2009/0042504 | A1* | 2/2009 | Kumm | E21F 1/145 454/167 |
| 2011/0294517 | A1* | 12/2011 | Hahm | G01C 17/28 455/456.1 |
| 2012/0203453 | A1* | 8/2012 | Lundquist | G01C 21/005 701/434 |
| 2013/0177208 | A1* | 7/2013 | Haverinen | G01C 21/206 382/103 |
| 2013/0179075 | A1* | 7/2013 | Haverinen | G01C 21/08 701/525 |
| 2013/0281111 | A1 | 10/2013 | Syrjarinne et al. | |
| 2013/0310069 | A1 | 11/2013 | Haverinen | |

(Continued)

FOREIGN PATENT DOCUMENTS

WO 2011-152645 A2 12/2011

OTHER PUBLICATIONS

Jan. 25, 2016 International Search Report issued in International Application No. PCT/EP20165/074788.

(Continued)

*Primary Examiner* — Michael J Zanelli
(74) *Attorney, Agent, or Firm* — Oliff PLC

(57) ABSTRACT

There is provided an apparatus configured to perform operations comprising: acquiring motion data sets from the plurality of mobile devices; estimating route models of the traveled routes on the basis of the motion data sets; generating EMF fingerprints for the traveled routes by associating the acquired EMF data sets with corresponding points of the route models; and determining the locations of the routes with respect to each other on the basis of at least one of the following: the EMF fingerprints and the route models.

31 Claims, 7 Drawing Sheets

(56) References Cited

U.S. PATENT DOCUMENTS

| | | |
|---|---|---|
| 2014/0142846 A1 | 5/2014 | Chun et al. |
| 2014/0180589 A1* | 6/2014 | Kim ...................... G01C 21/005 |
| | | 702/5 |
| 2014/0180627 A1 | 6/2014 | Naguib et al. |
| 2014/0295878 A1 | 10/2014 | Yang et al. |
| 2015/0018018 A1* | 1/2015 | Shen ....................... H04W 4/04 |
| | | 455/457 |
| 2015/0100262 A1* | 4/2015 | Park ....................... G01R 33/10 |
| | | 702/65 |
| 2015/0281910 A1* | 10/2015 | Choudhury ............. G01S 5/021 |
| | | 455/456.1 |

OTHER PUBLICATIONS

English-Language Translation of Apr. 15, 2016 Office Action issued in Korean Patent Application No. 10-2015-0128453.

* cited by examiner

SIMULTANEOUS LOCALIZATION AND MAPPING BY USING EARTH'S MAGNETIC FIELDS

FIELD

The invention relates generally to indoor positioning systems. More particularly, the invention relates to application of Earth's magnetic field measurements for mapping and positioning.

BACKGROUND

Global positioning system (GPS)-based location tracking or any other satellite based system may not work accurately inside a building due to lack of reliable reception of satellite coverage. Therefore, other means need to be considered.

BRIEF DESCRIPTION OF THE INVENTION

According to an aspect of the invention, there is provided an apparatus that comprises at least one processor and at least one memory including a computer program code, wherein the at least one memory and the computer program code are configured, with the at least one processor, to cause the apparatus to perform operations comprising: (i) acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown; (ii) acquiring motion data sets from the plurality of mobile devices; estimating route models of the traveled routes on the basis of the motion data sets; (iii) generating EMF fingerprints for the traveled routes by associating the acquired EMF data sets with the route models; and (iv) determining the locations of the routes with respect to each other on the basis of at least one of the following: the EMF fingerprints and the route models.

According to an aspect of the invention, there is provided a method that comprises (i) acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown; (ii) acquiring motion data sets from the plurality of mobile devices; (iii) estimating route models of the traveled routes on the basis of the motion data sets; (iv) generating EMF fingerprints for the traveled routes by associating the acquired EMF data sets with corresponding points of the route models; and (v) determining the locations of the routes with respect to each other on the basis of at least one of the following: the EMF fingerprints and the route models.

According to an aspect of the invention, there is provided a computer program product embodied on a distribution medium readable by a computer and comprising program instructions which, when loaded into an apparatus, execute a method comprising: (i) acquiring motion data sets from the plurality of mobile devices; (ii) estimating route models of the traveled routes on the basis of the motion data sets; (iii) generating EMF fingerprints for the traveled routes by associating the acquired EMF data sets with corresponding points of the route models; and (iv) determining the locations of the routes with respect to each other on the basis of at least one of the following: the EMF fingerprints and the route models.

According to an aspect of the invention, there is provided an apparatus comprising means for executing the above-discussed method.

Embodiments of the invention are described in more detail below.

LIST OF DRAWINGS

In the following, the invention will be described in greater detail with reference to the embodiments and the accompanying drawings, in which FIG. 1 presents a floor plan of a building;

DESCRIPTION OF EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

In order to enable positioning, a GPS based location discovery and/or tracking is known. The GPS location discovery may not, however, be suitable for indoors due to lack of satellite reception coverage. For indoor based location tracking, RF based location discovery and location tracking may be used. In such system, a round trip time of the RF signal, or the power of the received RF signal, for example, may be determined to an indoor base station to which the user device is connected to. Some other known positioning measures, which may be applicable indoors, include machine vision, motion sensor and distance measuring, for example. However, these may require expensive measuring devices and equipment mounted throughout the building. As a further option for location tracking and estimation indoors, a positioning technique, which applies Earth's magnetic fields, may be applied. This type of location discovery applies, for example, a magnetic field strength measured by a mobile device.

The material used for constructing the building may affect the EMF measurable indoors and also the EMF surrounding the indoor building. For example, steel, reinforced concrete, and electrical systems may affect the EMF. The EMF may vary significantly between different locations in the building and may therefore enable accurate location discovery and tracking inside the building based on the EMF local deviations inside the building. On the other hand, the equipment placed in a certain location in the building may not affect the EMF significantly compared to the effect caused by the building material, etc. Therefore, even if the layout and amount of equipment and/or furniture, etc., change, the measured EMF may not change significantly.

Figure 1:
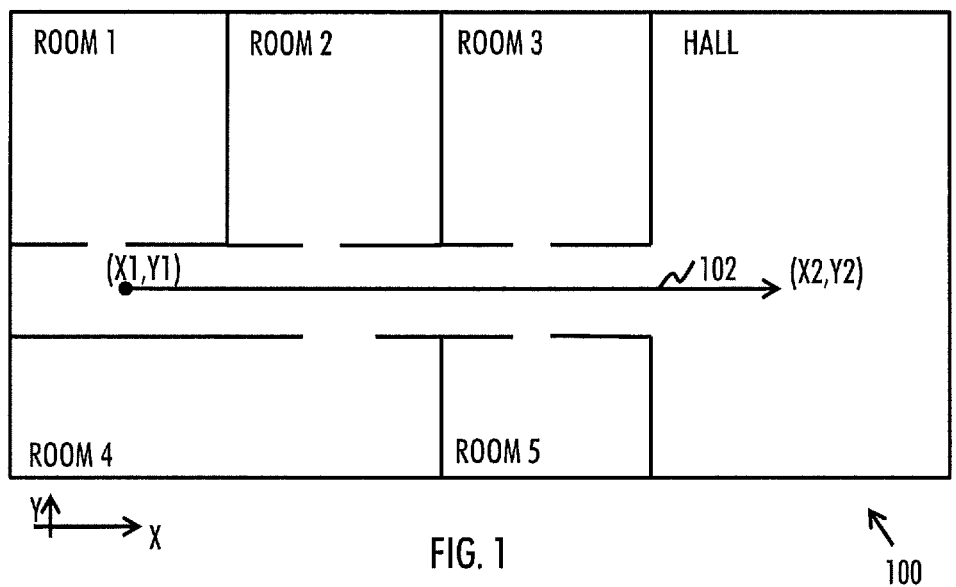

An example of a building 100 with 5 rooms, a corridor and a hall is depicted in FIG. 1. It is to be noted that the embodiments of the invention are also applicable to other type of buildings, including multi-floor buildings. The floor plan of the building 100 may be represented in a certain frame of reference. A frame of reference may refer to a coordinate system or set of axes within which the position, orientation, etc. of a mobile device are measured, for example. Such a frame of reference of the building in the example of FIG. 1 may be an XY coordinate system, also known in this application as the world coordinate system. The coordinate system of the building 100 may also be three dimensional when vertical dimension needs to be taken into account. The vertical dimension is referred with Z, whereas X and Y together define a horizontal two-dimensional point (X, Y). In FIG. 1, the arrow starting at a point (X1, Y1) and ending at a point (X2, Y2) may be seen as a path 102 traversed by a user associated with an EMF mobile device. The vertical Z dimension is omitted for simplicity.

The mobile device is detailed later, but for now it may be said, that the mobile device may comprise a magnetometer or any other sensor capable of measuring the EMF, such as a Hall sensor or a digital compass. The magnetometer may comprise at least one orthogonal measuring axis. However, in an embodiment, the magnetometer may comprise three-dimensional measuring capabilities. Yet in one embodiment, the magnetometer may be a group magnetometer, or a magnetometer array which provides magnetic field observation simultaneously from multiple locations spaced apart. The magnetometer may be an accurate sensor capable to detect any variations in the EMF. In addition to the strength, also known as magnitude, intensity or density, of the magnetic field (flux), the magnetometer may be capable of determining a three-dimensional direction of a measured EMF vector. To this end, it should be noted that at any location, the Earth's magnetic field can be represented by a three-dimensional vector. Let us assume that a compass needle is tied at one end to a string such that the needle may rotate in any direction. The direction the needle points, is the direction of the Earth's magnetic field vector.

Figure 2:
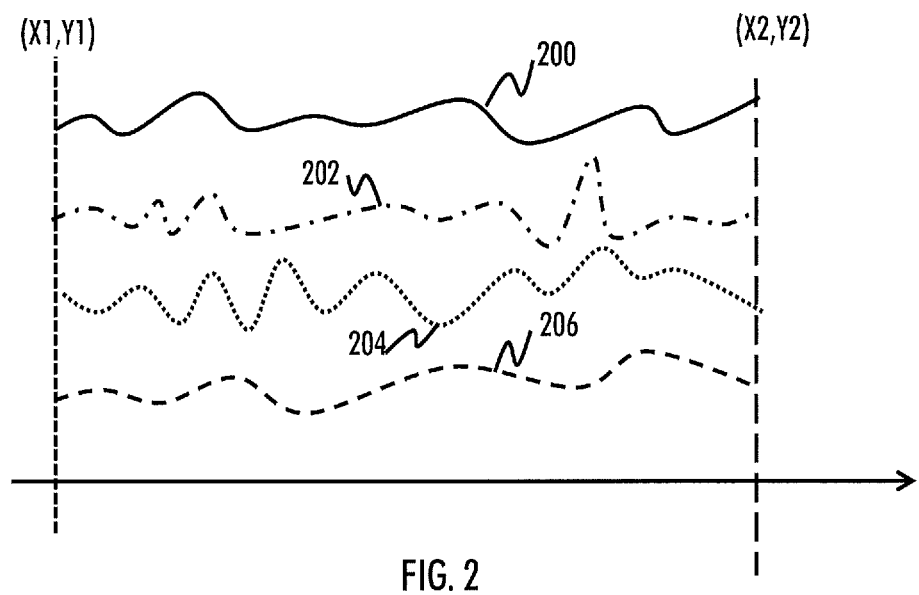
FIG. 2 shows an example measured magnetic field vector.

As said, the magnetometer carried by a person in the mobile device traversing the path 102 in FIG. 1 is capable of determining the three-dimensional magnetic field vector. Example three components of the EMF vector as well as the total strength are shown in FIG. 2 throughout the path 102 from (X1, Y1) to (X2, Y2). The solid line 200 may represent the total strength of the magnetic field vector and the three other lines 202 to 206 may represent the three component of the three dimensional magnetic field vector. For example, the dot-dashed line 202 may represent the Z component (vertical component), the dotted line 204 may represent the X component, and the dashed line 206 may represent the Y component. From this information, the magnitude and direction of the measured magnetic field vector may be extracted.

In location tracking/discovery of mobile device on the basis of the EMF measurements, or any target object moving in the building 100, each EMF vector measured by the mobile device carried by a person may be compared to existing information, wherein the information may comprise EMF vector strength and direction in several locations within the building 100 or within a plurality of buildings. The information may thus depict an indoor Earth's magnetic field map. As implied by the word "map", the EMF map comprises location specific data: each location in the map is associated with a certain EMF value (magnitude and/or direction), for example. As the amount of data in the EMF map, typically covering many buildings, may be large, the EMF map may be stored in a database entity or a server instead of the mobile device having limited computational capabilities. The mobile device may thus transmit EMF measurement results to the database entity in a network, i.e. to a cloud, which performs the comparison against the EMF map. As a result, the database entity may then return a location estimate to the mobile device. In another embodiment, the database storing the EMF part, or at least part of the EMF map, is in the mobile device. Therefore, in this embodiment, the mobile device need not transmit the measurement results to the server in the cloud.

One problem related to the positioning technique based on the EMF is that the generation of the EMF map needs extensive work from the mappers, i.e. from persons who travel within the building and collect the EMF vector values (strength and/or direction). It may be noted that there is a large number of buildings for which the EMF map may need to be generated. Therefore, there is proposed a mapping technique in which ordinary people who are running a magnetometer, e.g. during an execution of an EMF based location tracking software/application, in their mobile devices may contribute to the generation of the EMF map. Such mapping technique may be called simultaneous localization and mapping (SLAM).

In the proposed EMF based SLAM, persons build up the EMF map in an indoor environment (without a priori knowledge of the EMF map), or update the already existing EMF map within a known environment (with a priori knowledge of the current EMF map). In an embodiment, the mappers may, at the same time, at least try to keep track of their current location on the basis of the measured EMF values.

Figure 3A:
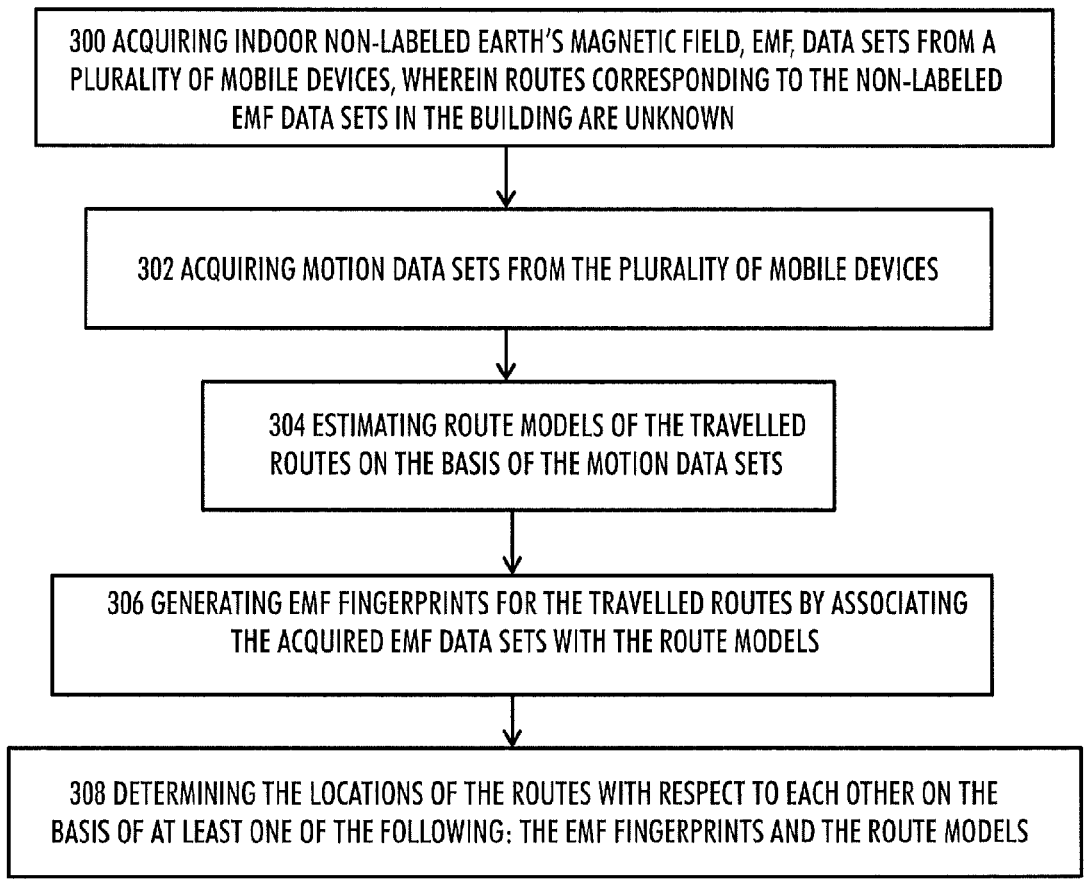
FIG. 3A shows a method according to an embodiment.
Figure 3B:
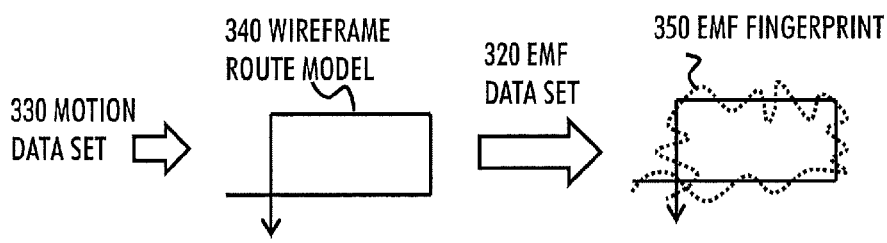
FIG. 3B shows how a route model and a magnetic fingerprint may be associated, according to an embodiment.
Figure 4:
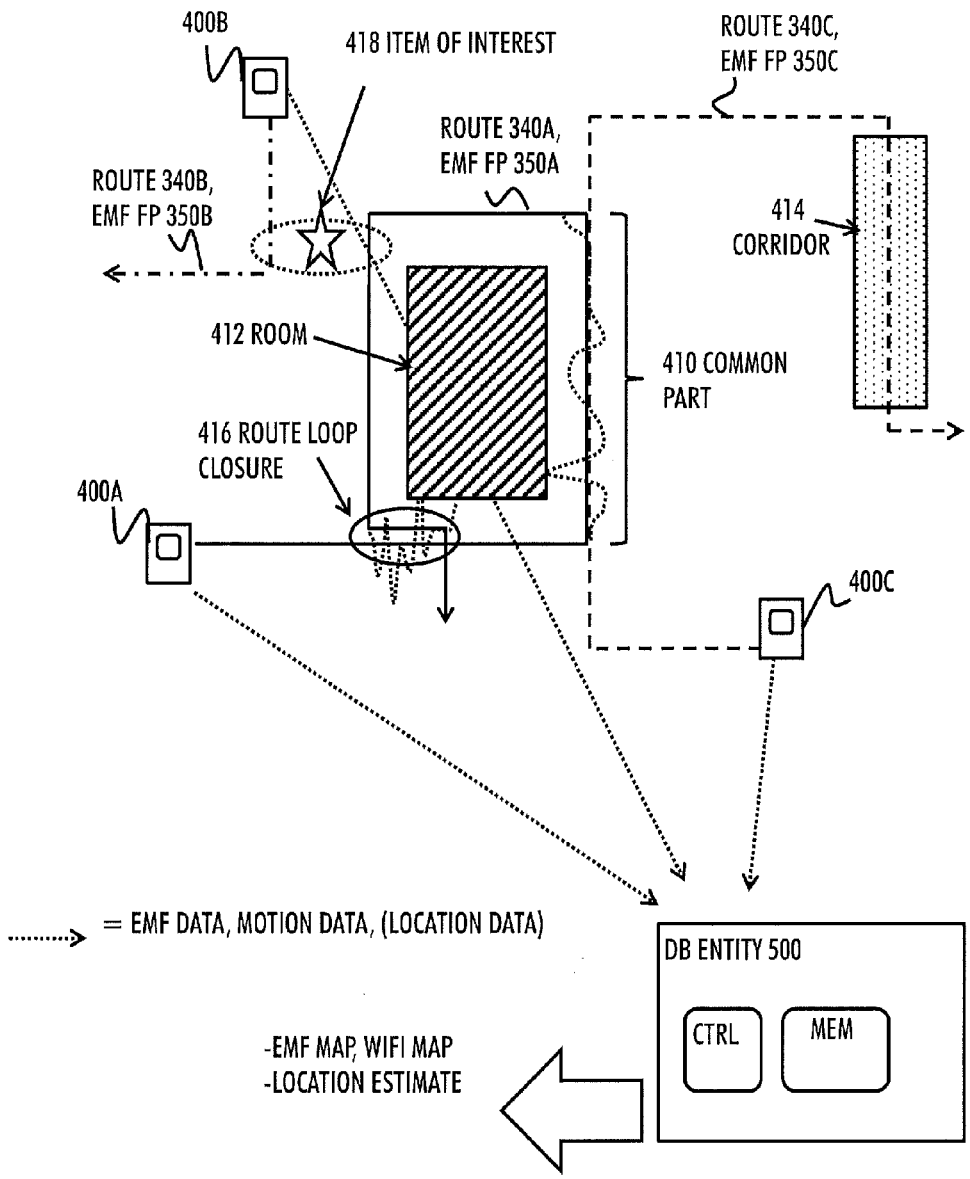
FIG. 4 shows a building in which several mobile devices move and provide motion data sets and Earth's magnetic field data sets to a database entity, according to some embodiments.

Accordingly, with reference to FIGS. 3A, 3B, and 4 it is proposed that a database entity 500 acquires in step 300 indoor non-labeled EMF data sets 320 representing at least one of magnitude and direction of the EMF in the building 100 from a plurality of mobile devices 400A, 400B, 400C (commonly referred with a reference numeral 400). The routes corresponding to the non-labeled EMF data sets 320 in the building 100 may be unknown. The routes are marked in FIG. 4 with a solid line (a route 340A for the mobile device 400A), with a dash-dotted line (a route 340B for the mobile device 400B, and with a dashed line (a route 340C for the mobile device 400C). The database entity 500 may receive results (sequences) of unlabeled EMF measurements performed by the mobile devices 400A-400C, or features calculated from the EMF measurement results. The database entity 500 may not know the locations of the mobile devices 400A-400C in the building, as there may not be any EMF map currently available. Further, in an embodiment, the database entity 500 may not know in which building the mobile devices 400A-400C have performed the EMF measurements. However, in one embodiment, the building 100 and/or floor in the building 100 is identified on the basis of satellite positioning or wireless radio frequency signals, such as WiFi signals, as will be explained. The radio frequency signals may be used to detect an identifier of a basic service set (BSS ID) or an identifier of a Bluetooth access point. The radio frequency signals may also be measures to determine received signal strengths which may also be used in locating the mobile devices 400A-400C.

In step 302, the database entity 500 may further acquire motion data sets 330 from the plurality of mobile devices 400A-400C. The motion data sets 330 may be measured by inertial sensors of the mobile devices 400A-400C. That is, in addition to performing the EMF measurements, the mobile devices 400A-400C may perform inertial measurements while moving. Each inertial measurement result represents at least one of the following with respect to the movement of the mobile device 400: velocity (either angular or linear), acceleration, orientation, distance traveled, and stride-related information (e.g. walking/running steps taken). The inertial measurements may be performed with corresponding sensors, such as accelerometers, gyroscopes, and/or other inertial measurement units (IMU) known to a skilled person. The orientation may refer to the three-dimensional orientation of the mobile device 400 with respect to, e.g., the building coordinates (such as to the frame of reference of the floor plan). The stride related information may imply whether or not the mobile device 400 is moving and also what the speed of the movement is.

Therefore, each motion data set 330 may indicate, for example, distance of the traveled route and information about turns during the route 402A-402C, such as the change in the direction of propagation (e.g. in angles) in each turn. The motion data sets 330 may also indicate the speed of the corresponding mobile device 400A-400C that transmitted the motion data set 330. The speed information may be based on accelerometers or step detectors at least operatively coupled to the mobile device 400A-400C. In an embodiment, the speed information may be based on an assumption of average speed of a person carrying the mobile device. In an embodiment, the intensity of the vibration motion of the mobile device 400A-400C may be used for estimating the speed. This embodiment may be especially useful in case the mobile device 400A-400C is attached to a shopping cart, for example, or to any other element to which the movement of the element causes shaking/vibration effect.

In step 304, the database entity 500 may then estimate route models 340A-340C (commonly denoted with a reference numeral 340) of the traveled routes on the basis of the motion data sets 330. These estimated route models may also be called wireframe route models. The wireframe route models 340, as shown in FIGS. 3B and 4, indicates the estimated path the corresponding mobile device has traversed. As the motion data sets 330 indicates the distance of the route traveled and any turns during the route, the wireframe route model 340 may give relatively accurate representation of the shape of the route traversed. Naturally, there may be inaccuracies in the motion data, such as drifting of the gyroscope, but let us first consider that the inaccuracies are negligible. Therefore, even though the database entity 500 may not be able to locate the route with respect to the building 100 (due to the lack of EMF map of the building 100, for example), the database entity 500 may be able to estimate the shape of the traveled route (i.e. the wireframe route model 340).

Thereafter, the database entity 500 may in step 306 generate EMF fingerprints 350A-3500 (commonly referred with a reference numeral 350) for the traveled routes by associating the acquired EMF data sets 320 with corresponding points of the wireframe route models 340. This is shown in FIG. 3B as well. In an embodiment, the EMF data sets 320 are time-stamped such that the database entity 500 knows the time instant of each EMF measurement. The mobile devices 400 may measure the time with an internal clock. Owing to the motion data set 330 (which may be time stamped as well), the database entity 500 may know the location of the mobile device 400A along the route with respect to each time stamped EMF data sample of the EMF data set 320. Then the database entity 500 may assign each EMF data sample to a specific location along the wireframe route model 340 in order to obtain the EMF fingerprint 350 for each traveled route. It may be noted that the database entity 500 may estimate the location of the mobile device 400A-400C on the route at a given time instant on the basis of the motion data set 330. In case the person carrying the mobile device 400A-400C is moving at a varying speed during the route, the location of the person carrying the mobile device 400 may be estimated at least partly on the speed information of the motion data.

In step 308, the database entity 500 may determine the locations of the routes 340A-340C with respect to each other on the basis of at least one of the following: the EMF fingerprints 350 and the wireframe route models 340A-340C. For example, the routes 340A-340C may be determined to locate with respect to each other, as shown in FIG. 4.

Figure 5:
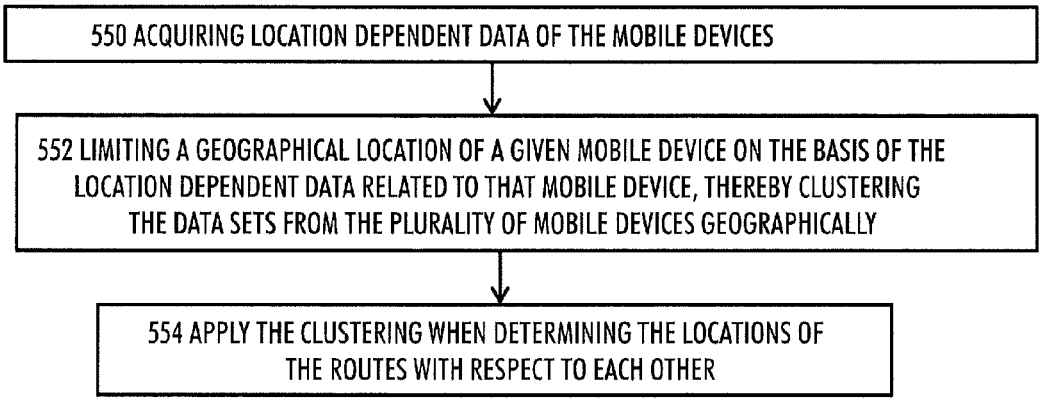
FIG. 5 shows a method according to an embodiment.

Let us first consider an embodiment in which the locations of the routes 340A-340C with respect to each other are estimated on the basis of the EMF fingerprints 350 alone. As shown in FIG. 5, there may be parts 410 of the EMF fingerprints 350 that are substantially similar. There may be a preset threshold according to which two (or more) EMF sequences are categorized as similar. The threshold may be set with respect to certain statistical measure of the EMF fingerprint, for example. In FIG. 4, the mobile devices 400A and 400C have been identified to provide similar EMF fingerprints at one part 410 of the routes 340A and 340C. Therefore, this part is denoted as a common part 410 and the database entity 500 may decide that these two routes 340A and 340C overlap at this part 410. Even though not necessarily being able to determine the exact location of the mobile devices 400A, 400C in the building 100 (in case no location specific EMF map is stored or available), the fact that the EMF results 350A, 350C match at least partly may be enough for indicating enough about the movements of the devices 400A, 400C. This information may also be used for determining that there may be an intersection at the point where the two routes 340A and 340C deviate, as will be described later.

In an embodiment, the locations of the routes 340A-340C with respect to each other are estimated on the basis of the wireframe route models 340A-3400. For example, it may be detected that the shape of at least two wireframe routes 340A-340C are substantially similar for a part of the routes. It may not be enough to detect only straight parts of the routes, as straight paths may occur in many routes. However, for example several identical (or at least substantially identical) turns in two (or more) different routes 340A-340C may be enough to determine that these parts of these routes overlap. It may be, for example, that two motion data sets 330 indicate similar turns with a similar distance between the turns. In such case, these routes may at least partially overlap and the database entity 500 may detect this.

In an embodiment, both the EMF fingerprints 350 and the wireframe route models 340A-340C are taken into account when determining the locations of the routes 340A-340C with respect to each other. This may provide more reliable and accurate determination of the locations of the routes 340A-340C with respect to each other.

As said, the data sets 320 and 330 may be unlabeled, that is, the locations of the respective measurements are unknown. Imagine that several mappers provide the data sets 320, 330 to the database entity 100. The mappers may be located in different floors of one building, in different buildings, in different cities/villages, or in different countries, etc. It may be important to be able to cluster the plurality of data sets 320, 330 to a certain geographical area such that the data sets 320, 330 from different areas are not compared together, for example, when executing the step 308. Therefore, it is proposed in step 550 of FIG. 5 that the database entity 500 further acquires location dependent data of the mobile devices 400. This location dependent data may be any data that may be used to detect the current location of the mobile device 400 with certain, preset accuracy.

In an embodiment, the building of the mobile device 100 may be determined based on the location dependent data. In an embodiment, the floor of the building in which the mobile device 100 is may be determined based on the location dependent data. In an embodiment, the city in which the mobile device 100 is may be determined based on the location dependent data. In an embodiment, the country in which the mobile device 100 is may be determined based on the location dependent data. In an embodiment, the longitude and/or latitude coordinates country in which the mobile device 100 is may be determined with certain accuracy based on the location dependent data.

In an embodiment, the location dependent data comprises data related to measured WiFi (i.e. wireless local area network) radio frequency signal. This type of data may indicate the reception strength of the WiFi signal or an identifier of the WiFi signal. In an embodiment, the location dependent data comprises data related to identifier of an access point. The identifier may be e.g. service set identifier (SSID) or a basic service set identifier (BSSID), both of which may identify the access point transmitting the RF signal, such as the WiFi signal. This may indicate the location of the access point and thereby indicate the location of the mobile device 400 receiving the WiFi signal. There may be several access points in the building and it may be possible to identify the floor of the mobile device 400 based on the identifier.

In an embodiment, the location dependent data comprises data related to measured Bluetooth or Bluetooth low energy (BLT, BLT LE) radio frequency signal. The information of the Bluetooth signal may be used in a similar fashion as the data related to the WiFi signals. The coverage area of the BLT is typically smaller than with WiFi. Therefore, BLT/BLT LE signals may provide accurate positioning of the mobile device 400.

In an embodiment, the location dependent data comprises data related to measured cellular radio frequency signal. The information of the cellular signal may be used in a similar fashion as the data related to the WiFi/BLT signals. However, locating the mobile device 400 based on the cellular signals may not be as accurate as in case of WiFi/BLT, as the coverage area of the cellular signals is typically larger. Nevertheless, cellular coverage is present in most areas and may thus provide a reliable and g-present means for detecting the geographical location of a given mobile device.

In an embodiment, the location dependent data comprises data related to measured satellite radio frequency signal. This type of signal may be e.g. a global positioning system (GPS) signal and it may be used to identify at least the outdoor location of the mobile device 400. Detecting the outdoor location may further aid in detecting the building 100 in which the mobile device 400 entered.

In an embodiment, the location dependent data comprises data related to measured air pressure. This may be used to indicate the altitude of the mobile device 400, such as the floor of the building.

In an embodiment, the location dependent data comprises data related to an identifier of the mobile device 400. In an embodiment, the identifier may be medium access control (MAC) address. In an embodiment, the identifier may be an identifier related to the subscriber identity module (SIM). In an embodiment, the identifier may be a phone number. In an embodiment, the identifier may indicate whether the mobile device 400 is roaming or not. In an embodiment, the identifier of the mobile device 400 may be associated to the owner of the mobile device 400 and the address (=location) of the owner may be known. Therefore, such an identifier may imply the country in which the mobile device 400 currently is.

In an embodiment, the location dependent data comprises data related to measured direction of the Earth magnetic field. The direction of the EMF may, at least in outdoor, indicate the direction of the North Pole, and this may indicate the location of the mobile device 100 with certain accuracy. In an embodiment, the location dependent data comprises data related to ambient light. The amount of ambient light may imply the location of the mobile device 400 with certain accuracy. In an embodiment, the location dependent data comprises data related to humidity. This may also reveal the location of the mobile device 400 with certain accuracy.

In an embodiment, the location dependent data comprises data related to audio signal, an image, video signal. This may reveal the location of the mobile device 100 as, e.g., an image of an Eiffel tower may indicate that the mobile device 400 is currently in Paris or an image of the Mona Lisa painting may indicate the building in which the mobile device 400 currently is.

In an embodiment, the location dependent data comprises detection of a location-dependent event. The event may be, e.g., entry/exit to/from the building, or a payment event (e.g. when performing a payment with the mobile device, the cash register may detect and indicate the presence of the mobile device 400). The indication may be sent to the database entity 500. This may reveal the location of the mobile device 100.

In an embodiment, the mobile device 400 may transmit such location dependent data to the database entity 500 along with the EMF and motion data sets 320, 330. In an embodiment, the location dependent data is transmitted as metadata as part of the data format of the data sets 320 and/or 330. However, in another embodiment, the database entity 500 has an access to the mobile device 400 such that the database entity 500 may search for captured images, detect RF signals, detect identifier(s) of the mobile device 400, or to determine any other of the above mentioned location dependent data of the mobile device 400. In yet one embodiment, the database entity 500 has access to the social network services, such as to Instagram, Twitter or Facebook, in order to detect the status updates or images/videos/audio signals transmitted by a certain mobile device 400 and thereby keep track of the location of the mobile devices 400.

As described above, the database entity 500 may obtain location dependent data of the mobile device 100. Thereafter, in step 552, the database entity 500, which may receive a large number of motion data sets 330 and EMF data sets 320 from a large number of mobile device 400 from many parts of the world, may limit the geographical location of a given mobile device 400 on the basis of the acquired location dependent data of that mobile device 400, thereby clustering the data sets from the plurality of mobile devices 400 geographically. This may be beneficial in that the database entity 500 knows which data sets 320, 330 are from the same geographical area. In an embodiment, the accuracy of the geographical area is a building accuracy. In an embodiment, the accuracy of the geographical area is a floor accuracy. Owing to such knowledge the database entity 500 may decide to match/compare only the data sets 320, 330 from mobile devices 400 which are in the same geographical area. For example, data sets 320, 330 from mobile devices which are in different buildings are not compared. Thus, the database entity 500 may then, in step 554, apply the performed clustering when determining the locations of the routes with respect to each other. This may reduce the computational complexity and reduce errors. The database entity 500 may, e.g., start from a relatively small "initial" area and map that initial area based on data sets from users that are clustered to that area. Then, the database entity 500 may gradually enlarge the covered area by looking at data sets that are clustered to come from locations that are in proximity of or overlap the initial area. This may provide for a computationally efficient manner in building a map for the entire building or buildings.

In an embodiment, the clustering takes place on the basis of the generated EMF fingerprints 350. In this embodiment, the EMF fingerprints 350 may be compared to each other and detected which ones are similar (according to predefined criterion). Then these EMF fingerprints 350 may be determined to be from the same geographical area.

In an embodiment, the database entity 500 may generate an EMF map of the geographical area in which the mobile devices 400A-400C are on the basis of the locations of the routes 340A-340C with respect to each other and the corresponding EMF fingerprints 350A-350C. The geographical area may be a specific building or a floor, for example, assuming such accuracy is obtained from the location dependent data.

For example, the database entity 500 may determine that the routes 340A-340C locate as shown in FIG. 4. Moreover, the database entity 500 may know the EMF samples over the routes 340A-350C and thus build the EMF map for these routes 340A-340C in the building 100. Over time the database entity 500 may acquire data sets 320, 330 from many more mobile devices 400 and further enhance the EMF map of the building 100. This may be beneficial as then the database entity 500 may use the EMF map in location estimation and tracking of trackee(s) in the building 100. For example, the database entity 500 may determine a location estimate of a trackee on the basis of the acquired EMF data set 320 from that trackee and the generated EMF map. Then, the database entity 500 may use the location estimate for own purposes (such as for analytics regarding the people density within the building 100) or provide the location estimate to the trackee, such as to a mobile device (e.g. a cellular phone). This may comprise transmitting the estimated location to the mobile device 400.

In an embodiment, the database entity 500 may detect hot spot locations in the building 100 on the basis of spatial distribution of EMF fingerprints 350 in the building 100. Hot spot locations are locations which are popular among persons in the building. For example, mobile devices 400A-400C may all pass through a hallway, an elevator, an exit, or an entry of the building 100. These locations may be hot spots of the building 100. On the contrary, a specific room of the building 100 may be visited only by a few mobile devices and therefore may not be regarded as a hot spot.

In an embodiment, there may be occasions in location estimation/tacking in which the database entity 500 may determine at least two probable locations for the current location of the trackee. This may happen due to similar EMF fingerprints being present in both locations. In such cases, the database entity 500 may apply the knowledge of the hot spot locations when deciding which of the at least two locations is most probable. For example, if the two estimated locations are a popular meeting room (which may have been earlier identified as one hot spot) and an individual work room, the database entity 500 may decide that the trackee is more likely in the popular meeting room. As the trackee moves in the area, the probability of the correct location may increase. However, in the beginning of the location estimation or in case of a static trackee, it may be beneficial to consider which locations are popular and which are not.

In an embodiment, the database entity 500 may detect an uncertainty location in the building 100. Such uncertainty location may mean a location in which an EMF fingerprint 350 which is similar, according to a predetermined criterion, to an EMF fingerprint in at least one other location in the building 100. This may cause uncertainties in location estimation and/or tracking. Therefore, the database entity 500 may cause an indication according to which at least one of the locations needs to be modified. This type of modification may include performing at least one of the following: adding a magnetic object in the location and enabling a use of another location technique in the location. The addition of the magnetic object in one of the uncertain places may change the EMF fingerprint of the location so that it is distinguishable over other locations. The other location technique may be e.g. WiFi, Bluetooth or any other RF signal based location tracking technique. For example, adding a WiFi access point may aid in distinguishing one location over another. The indication may be given to administrator or maintenance personnel of the building 100. The indication may be an automatic transmittal of an electronic message, such as email or SMS from the database entity 500 to a preset target entity.

In one embodiment, the database entity 500 may generate a floor plan of the building 100 on the basis of the determined locations of the routes 340A-340C with respect to each other. For example, looking at FIG. 4, it may be estimated that there are corridors surrounding a space 412 because the route 340A forms a square around the space 412. The space may be a room, for example. Naturally, only one route 340A may not be sufficient to derive such an assumption of the room 412. However, as many people carrying mobile devices 400 walk in the building 100, the amount of data becomes large and then the assumption of the room 412 may be made more reliably. As a further example, a detection of a corridor 414 in the building 100 may be made on the basis of the motion data set(s) 330 showing direct propagation.

In an embodiment, as shown in FIG. 4, the database entity 500 may detect that a single EMF fingerprint 350A corresponding to one mobile device 400A comprises a similar EMF sequence at two parts of the wireframe route model 340A. Again, the similarity of the parts of the EMF fingerprint (FP) may be made on the basis of a similarity threshold (e.g. a variance of the EMF FP 350A). In an embodiment, the length of the part may be sufficient enough, according to e.g., empirical testing, so that a certain level of reliability is met. For example, it may be detected that measured EMF samples (as part of the EMF FP 350A) at two parts (denoted with a reference numeral 416) of the route 340A are similar. Therefore, the database entity 500 may determine that a route loop closure occurs along that part 416 of the wireframe route model 340A. This means that the mobile device 400A has traveled a route but returned to a location in which the mobile device 400A has already been during that route. Detections of route loop closures may be beneficial in forming the floor plan of the building.

Figure 6:
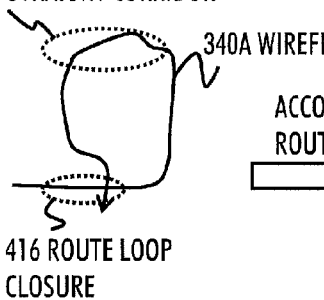
FIG. 6 shows when a route model may be corrected, according to an embodiment.
Figure 6:
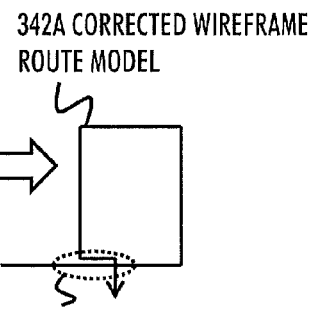

In one embodiment, as shown in FIG. 6, the database entity 500 may detect that the wireframe route model 340A, estimated on the basis of the motion data set 330 acquired from that mobile device 400A, does not coincide at that part 416 of the route loop closure. However, as explained above, the EMF data 350A may indicate that the route loop closure does take place. In such case, the database entity 500 may determine that the inertial sensors of that mobile device 400A have drifted (i.e. provide erroneous measurement results) and thereby cause the wireframe route model 350A not to coincide. As a result, the database entity 500 may perform a correction of the motion data set 330 acquired from that mobile device 400A, thereby reshaping the wireframe route model 340A of that mobile device 400A. The reshaped route model 342A is shown in FIG. 6. In other words, the route is forced to make a route loop closure at the part 416.

There may be also other parts of the erroneous wireframe route model 340A that may be corrected on the basis of EMF data sets 320 and/or motion data sets 330 from other mobile devices 400. For example, it may be deduced from the data sets 320, 330 from other mobile devices 400 that there is a straight corridor 600 at one part of the building 100. However, the motion data set 330 from the mobile device 400A may indicate a curved progression at that specific part 600 of the route 340A. This may be also corrected from the motion data set 330 from the mobile device 400A.

In an embodiment, the correction of the motion data set 330 may include setting a certain bias value for the motion data received from that mobile device 400A. The database entity 500 may then apply the bias/offset when it receives motion data results from the mobile 400A. In one other embodiment, the database entity 500 may reconfigure the inertial sensor(s) of the mobile device 400A so that the motion data 330 obtained from mobile device 400A is bias-corrected at the mobile device's end.

Figure 7:
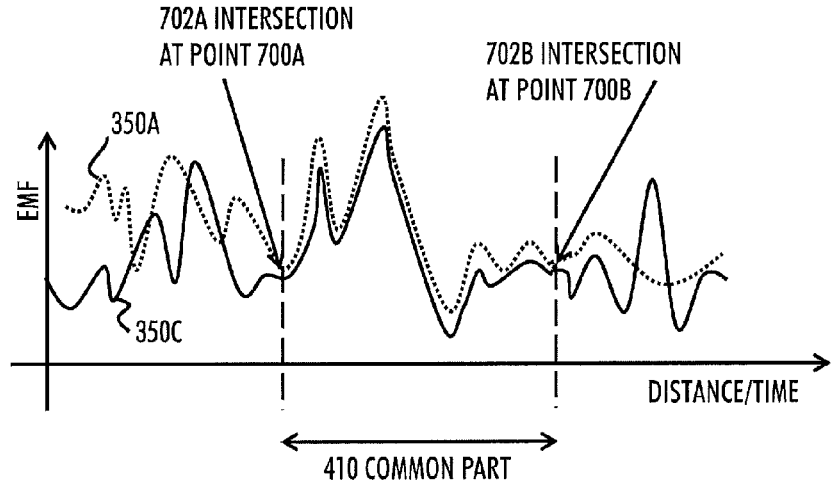
FIG. 7 shows detection of intersections in a building, according to an embodiment.

In an embodiment with respect to FIG. 4, the database entity 500 may detect that at least part of a first EMF fingerprint 350A matches, according to a predetermined likelihood, with at least part 410 of a second EMF fingerprint 350C. Again, the likelihood may be determined based on a predetermined criterion, such as a criterion related to the variance, or any other statistical variable, of the EMF FPs 350A, 350C. FIG. 4 displays the common part 410 and FIG. 7 depicts the EMF FPs 350A, 350C. The Y-axis shows the intensity of the measured EMF samples 350A, 350C, while the X-axis shows e.g. time or distance (based on motion data set 330) with respect to the measured EMF samples. As shown, the EMF FPs 350A and 350C are substantially similar over the part 410, whereas they are different at other parts. Naturally, such comparison need not be made always in this manner, but a statistical examination of the two EMF FPs 350A, 350C in any other manner is possible as well.

This detection may lead to the database entity 500 to determine that the two routes 340A, 340C, corresponding to these EMF FPs 350A, 350C, coincide at least partly. The coinciding part 410 may be a corridor, an elevator, or an escalator, for example. Therefore, the database entity 500 may determine that the points 700A, 700B of the wireframe route models 340A, 340C before and after the matching part 410 of the EMF fingerprints 350A, 350C comprise intersections 702A, 702B in the building 100. This may also be beneficial for forming the floor plan of the building 100. Whether the common part 410 is a corridor or an elevator, for example, may be detected from the motion data set 330. For example, a movement model of a person in an elevator or in an escalator may be substantially different from a movement model in a corridor. Moreover, detection of a WiFi signals, information from pressure sensors, etc. may indicate whether a floor is changed.

In an embodiment, the database entity 500 may acquire indications of items of interest from the mobile devices 400. Examples of items of interests may include decorations (such as paintings), or any items that a person carrying the mobile device 400 may find interesting for any reason. Looking at FIG. 4, there is one item of interest 418 which may have been detected by the mobile devices 400A, and 400B. Both of these devices 400A, 400B may send an indication of the item of interest 418 to the database entity 500, to a social network service, or to some other service. The indication may an image, a video, a status update, or whatever which indicates that the corresponding mobile device 400 is currently close to the item of interest. In one embodiment, the database entity 500 may access the memory of the mobile device and search for example captured images to see any items of interests.

Then the database entity 500 may associate each item of interest 418 to a corresponding point of a corresponding wireframe route model 340A, 340B. The detection of the item of interest(s) may be time-stamped. In this way, the database entity 500 may determine the locations of the routes 340A, 340B with respect to each other further on the basis of the indicated items of interests 418. In FIG. 4, for example, if two routes 340A, 340B of the mobile devices 400A, 400B are associated to a same item of interest 418, then it may be deduced that these routes 340A, 340B coincide at least partly close to item of interest 418. In case the indication of the item of interest 418 is a video or an image, the database entity 500 may further locate the routes 340A, 340B with respect to the item of interest 418. For example, it may be seen that the mobile device 400A passed the item of interest 418 on the right side, whereas the mobile device 400B passed the item 418 on the left side. This may further aid in locating the routes with respect to each other and aid in developing a floor plan for the building 100.

Figure 8:
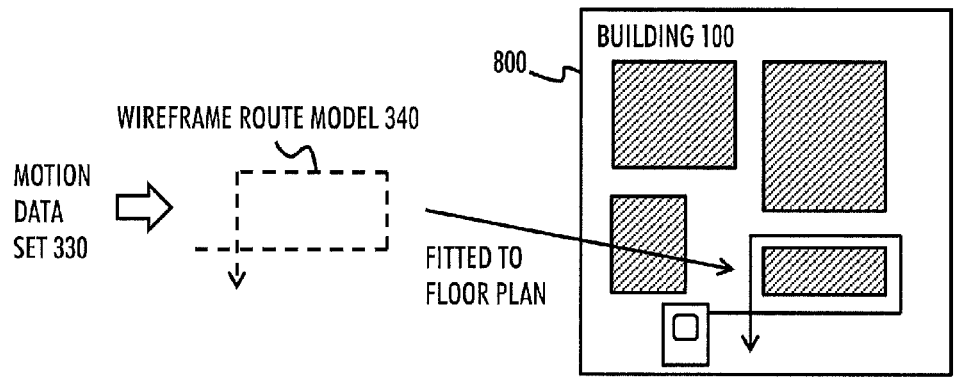
FIG. 8 shows fitting a route model to a floor plan, according to an embodiment.

In some embodiments, there is no floor plan initially available for the building 100 and the database entity 500 builds up the floor plan and/or EMF map for the building 100 as the database entity receives the EMF and motion data sets 320, 330 from at least one mobile device 400. However, in some other embodiments, the database entity 500 may initially store a floor plan of the building 100. The floor plan may be a complete or an intermediate floor plan of the building 100. An example floor plan 800 is shown in FIG. 8. The blocks with right leaning diagonal lines correspond to obstacles in the building 100, such as rooms, shelves, etc. The white marked areas are areas where people may travel. The stored floor plans may be based on information from different sources, such as on information from public floor plan databases (e.g. Google and Here) and/or on information from users carrying the mobile devices 400A-400C. The database entity 100 may then, in an embodiment as shown in FIG. 8, place the traveled routes in the floor plan 800 on the basis of the wireframe route models 340 and the stored floor plan 800 of the building 100. This may help in locating the routes in the building 100 because one type of wireframe route model 340 may only fit to one or only to a few spots of the building 100. For example, in FIG. 8, the depicted wireframe route model 340 only fits to one place of the floor plan 800. It may be noted that the exact building and/or floor in which the mobile devices move may be estimated beforehand by applying the location dependent data. Placing all the routes of all mobile devices 400 to the floor plan 800 may also help in locating the routes with respect to each other and thus aid in building an accurate and reliable EMF map of the building 100.

Figure 9A:
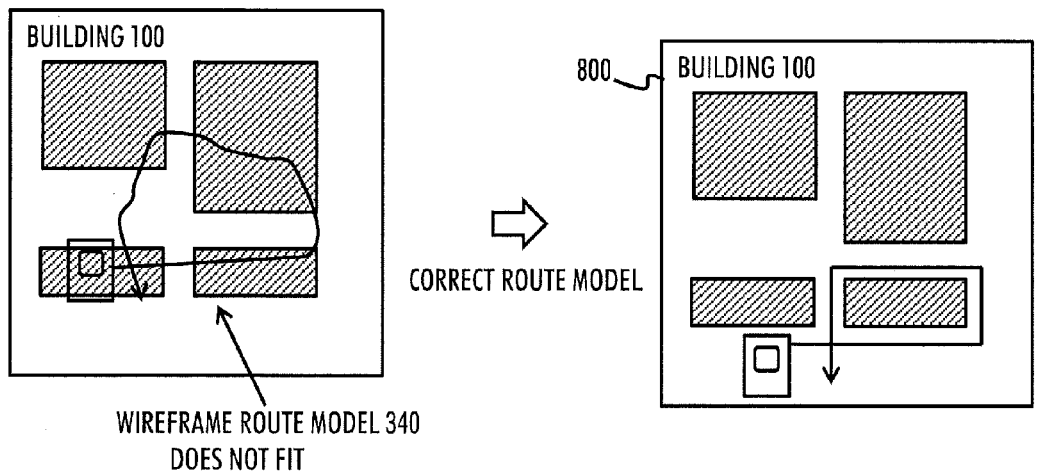
FIGS. 9A and 9B show some embodiments related to fitting the route model to the floor plan.

In an embodiment, the database entity 500 may, as shown in FIG. 9A, detect that the wireframe route model 340, estimated on the basis of the motion data set 330 acquired from the mobile device 400, does not fit correctly to any route on the floor plan 800. In such case, the database entity 500 may estimate the most likely traveled route of the floor plan 800 on the basis of the motion data set 330 and consider that route as the traveled route. The most likely traveled route may the route of the floor plan 800 that deviates least from the wireframe route model 340, for example.

Further, the database entity 500 may determine that the inertial sensors of that mobile device 400 have drifted and thereby cause the wireframe route model 340 not to match with the most likely traveled route. In other words, the motion data set 330 may be biased and provide erroneous motion data samples. As a result, the database entity 500 may decide to cause a correction of the motion data set 330 related to that mobile device 400, thereby reshaping the wireframe route model 340 of that mobile device 400. As a consequence, the corrected route model may now fit to the most likely traveled route of the floor plan 800. This may be beneficial in correcting the motion sensors of the mobile device 400 and in building an accurate and reliable EMF map of the building 100.

Figure 9B:
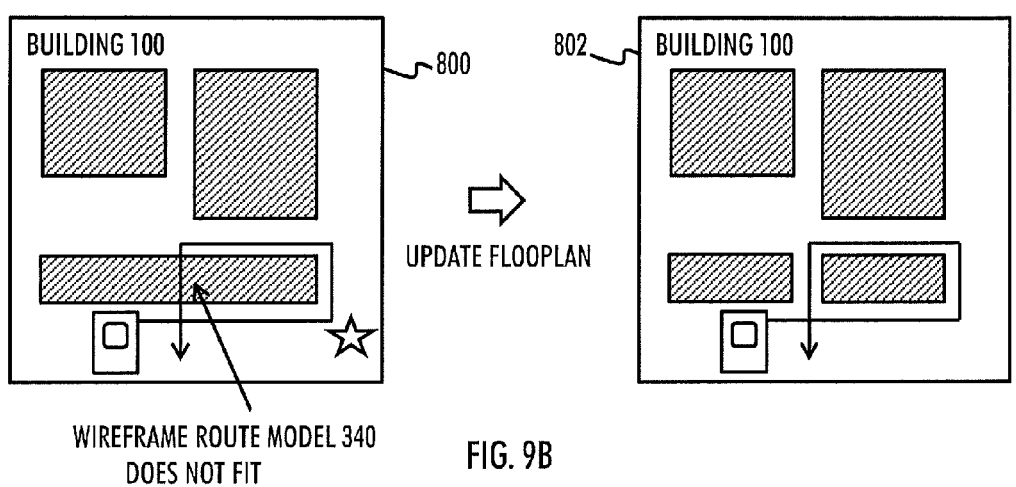

An embodiment, depicted in FIG. 9B, depicts a scenario in which the stored floor plan 800 is not up-to-date. In this embodiment, the database entity 500 may detect that the wireframe route model 340, estimated on the basis of the motion data set 330 acquired from the mobile device 400, does not fit correctly to any route on the stored floor plan 800. However, in this embodiment, there may be further indications which may imply that the estimated route is correct. These may include, for example, images of item of interests marked with a star in FIG. 9B. Further, in case the motion sensors of the mobile device 400 have been calibrated recently, then the database entity 500 may trust on the motion sensor readings. Based on these or any other accurate location dependent data, the database entity 500 may determine that the wireframe route model 340 is in fact accurate but the stored floor plan 800 is currently not up-to-date. Therefore, the floor plan 800 may be updated, as shown with the floor plan 802, on the basis of the wireframe route model 340. In this case, depicted in FIG. 9B, an obstacle had been removed so that persons may walk as the wireframe route model 340 indicates.

Figure 10:
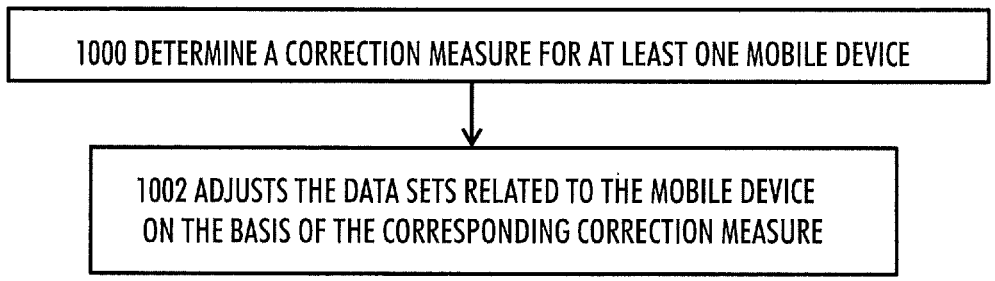
FIGS. 10 and 11 show methods, according to some embodiments.

In an embodiment, as shown in FIG. 10, the database entity 500 may in step 1000 determine a correction measure for at least one mobile device 400, wherein the correction measure of a mobile device indicates how to adjust the data sets 320, 330 related to that mobile device 400. Each data set 320, 330 from each mobile device may have its own correction measure. The deviation may be due to offset or bias. The database entity may then in step 1002 cause an adjustment of the data sets 320, 330 related to the mobile device 400 on the basis of the corresponding correction measure. This may provide for commensurate data sets 320 and/or 330 from the plurality of mobile devices.

In an embodiment, the adjustment for the motion data set 330 may be determined on the basis of the deviation between the wireframe route model 340 and the actually traveled route. The actually traveled route may be the most probably traveled route and it may be at least estimated, as explained above. This estimated correction may then be applied on the motion data set 330 acquired from that mobile device, thereby reshaping the wireframe route model 340 of that mobile device.

In an embodiment, the adjustment for the EMF data set 320 may be determined on the basis of the indicated EMF data samples and the known EMF magnitude and/or direction at the location of the mobile device 400. This may require that the EMF map for the building is known.

In an embodiment, the correction measure for a given mobile device 400 is based on software applications being run in the mobile device 400. For example, the database entity 500 may detect which applications are being run in the mobile device 400. These applications may affect the accuracy of the motion sensors and/or the magnetometer of the mobile device 400. Therefore, if this effect is known (empirically or otherwise), the effect may be reduced from the received data sets 320 and/or 330.

In an embodiment, the correction measure for a given mobile device 400 is based on type and/or model of the mobile device 400. Certain type and/or model of the mobile device may affect the reliability of the data sets 320, 330. Therefore, in an embodiment, the database entity 500 may detect the type and/or model of the inertial sensor which is used to provide the motion data sets 330. The transmission of data from the mobile devices 400 may include an identification of the types and/or models of the sensors. The database entity 500 may further detect that wireframe route models 340, estimated based on motion data sets 330 acquired from a certain type or model of an inertial sensor deviates from the correct traveled route. The deviation may be consistent. In order to avoid further errors from the inertial sensors of this type/model, the database entity 500 may cause a correction to the motion data sets 330 related to that type and/or model of inertial sensors.

Figure 11:
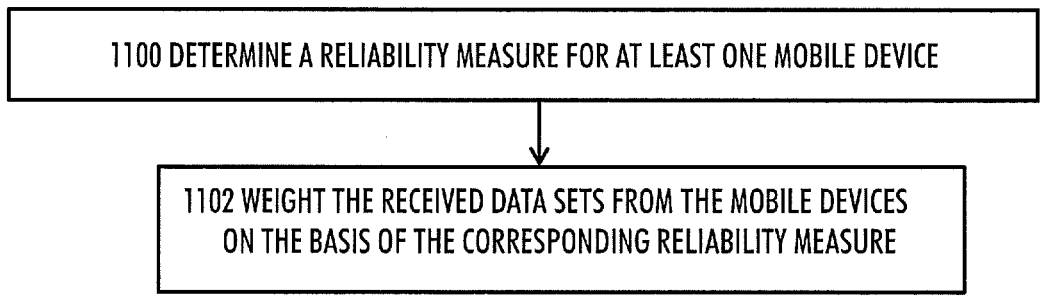

In one embodiment, as shown in FIG. 11, the database entity 500 may in step 1100 determine a reliability measure for at least one mobile device 400, wherein the reliability measure of a mobile device 400 indicates whether the data sets 320, 330 received from that mobile phone 400 are reliable or not. In step 1102, the database entity 500 may weight the received data sets 320, 330 from the mobile devices 400 on the basis of the corresponding reliability measure. For example, in case the reliability indicates accurate measurements, then the data sets 320, 330 may be given more weight in building of the floor plan and/or the EMF map. The reliability measure may be determined based on various different aspects. In an embodiment, the reliability measure for a given mobile device 400 is based on motion data set 330. If the motion data set 330 indicates that the mobile device 400 has experienced unnecessary movements (e.g. the user has hold the mobile device 400 in hands while walking), then the reliability measure may be lower than if the mobile device 400 was more static while walking (e.g. in a pocket). On the hand, if the mobile device 400 has run many software applications and at least one of them is known to be harmful to the accuracy of either the inertial sensors and/or the magnetometer, then the reliability measure may be reduced as well.

In one embodiment, the database entity initially stores at least part of the EMF map of the building 100. In such case, the database entity 500 may update the EMF map on the basis of the acquired EMF data sets 320 and the wireframe route models 340. It may be that the EMF in the building has changed since the last recording, so that an update is needed. Such change may be due to construction work in the building 100, for example. It may also be possible that the area which corresponds to the current EMF map is enlarged on the basis of the acquired EMF data sets 320 and the wireframe route models 340.

In an embodiment, the database entity 500 may acquire radio frequency (RF) based measurement results from the mobile device 400. The mobile devices 400 may detect RF signals during the traveled route (e.g. SSID, BSSID, strength). These time-stamped radio frequency based measurement results may then be associated with corresponding points of the wireframe route models 340. In such a manner, the database entity 500 may also generate and/or update a radio frequency map of the building 100. This may eventually result in higher accuracy in location estimation and tracking as the wireless local area network (WLAN) RF map is accurate and up-to-date. In a similar fashion any other database related to the building 100 may be updated or generated. Such other databases may include e.g. pressure maps.

In an embodiment, the database entity 500 may apply the motion data set 330 for correcting/compensating the three-dimensional orientation of the mobile device 400, e.g., to correspond to the frame of reference of the floor plan. Alternatively, the mobile device 400 may perform correction of three-dimensional orientation prior to causing the transfer of the data sets 320, 330 to the database entity 500. For example, in order to determine the amount of rotation about the Y-axis and about X-axis, the mobile device 400 may be equipped with IMU. The IMU may comprise at least one acceleration sensor utilizing a gravitational field. The IMU may optionally also comprise other inertial sensors, such as at least one gyroscope, for detecting angular velocities, for example. The acceleration sensor may be capable of detecting the gravitational force G. By detecting the acceleration component G caused by the Earth's gravitation, the mobile device 400 may be able to determine the amount of rotation about axis X and/or Y. The rotation about the Z-axis may be compensated by using the information given by the gyroscope, for example.

In an embodiment, there may be a low range communication unit mounted in the building 100 for allowing calibration of the mobile device 400 to the correct EMF vector values. For example, the exact magnitude of the EMF may be predetermined and stored in the memory of the mounted low range communication unit. Then the mobile device 400 may apply this information in obtaining knowledge of how much the measured EMF magnitude deviates from the indicated, true EMV magnitude. Based on the information, a correction of the values provided by the magnetometer or calibration of the magnetometer may be in order. The low range communication may apply, for example, RFID, Bluetooth, or NFC technique. Alternatively, or in addition to, the calibration/correction may be for the direction of the EMF vector. The calibration process may also calibrate/correct data related to the direction and/or strength of the measured acceleration vector representing the direction of the gravitational force G. For this, the true value for G may have been determined for the predetermined location of the mounted low range communication unit.

Figure 12:
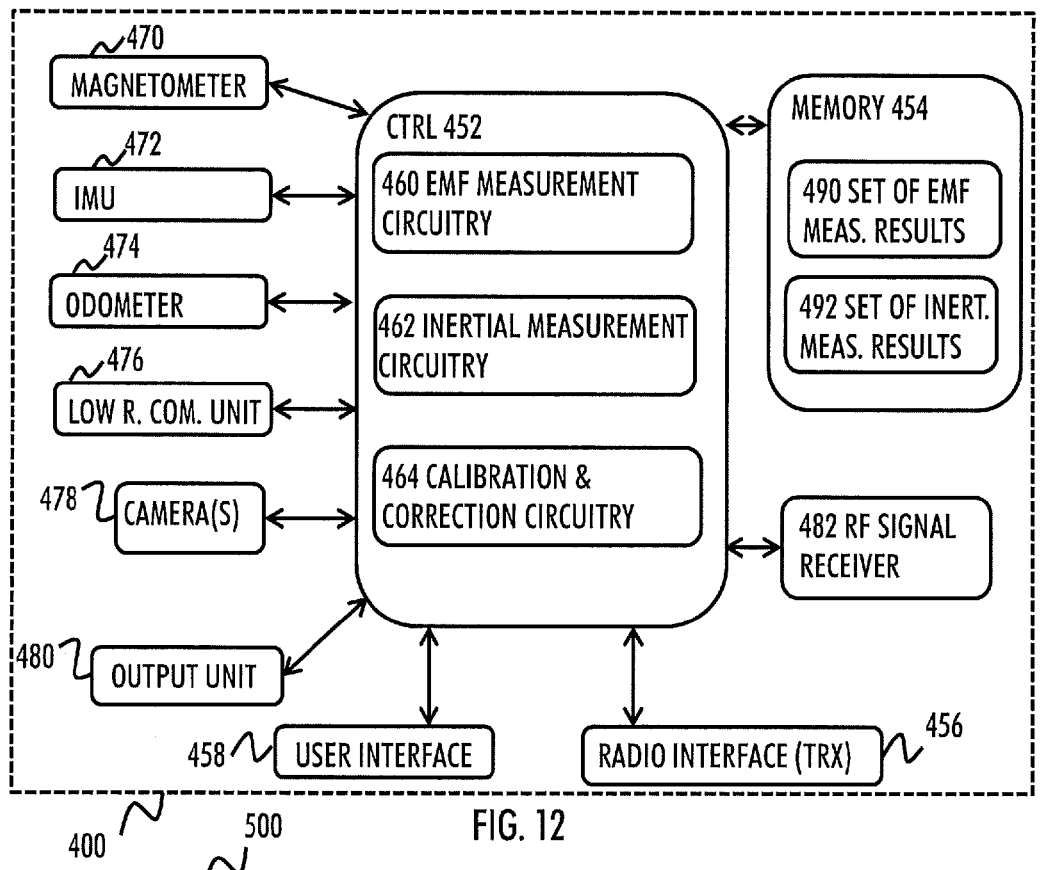
FIGS. 12 and 13 illustrate apparatuses according to embodiments.
Figure 13:
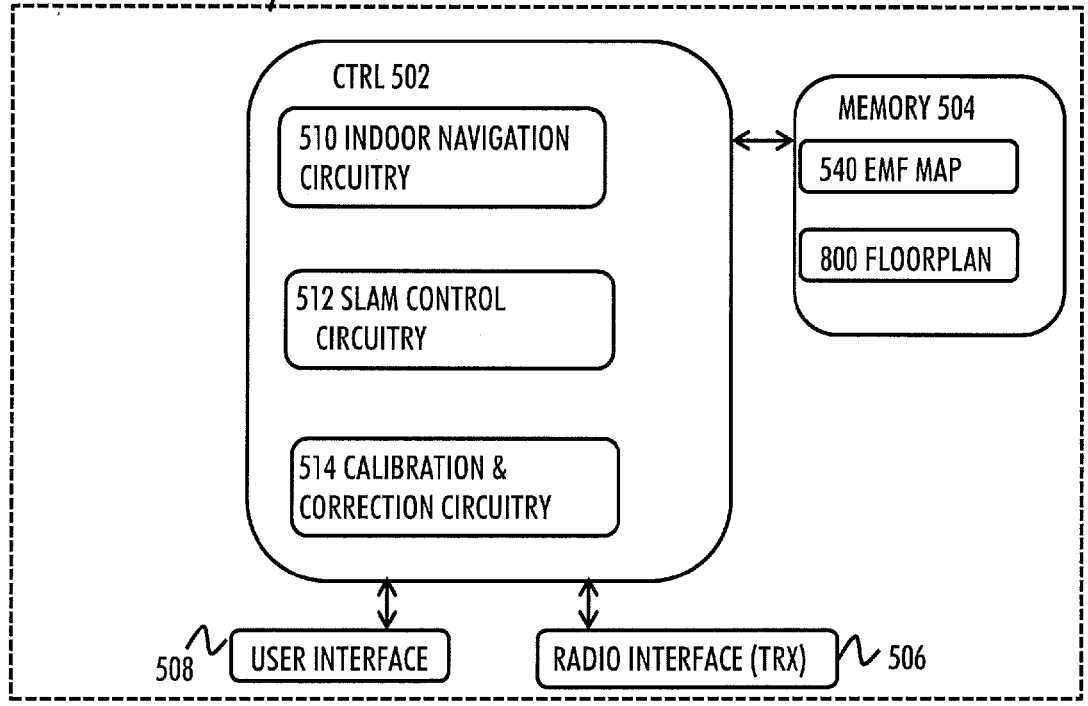

Embodiments, as shown in FIGS. 12 and 13, provide apparatuses 400 and 500 comprising at least one processor 452, 502 and at least one memory 454, 504 including a computer program code, which are configured to cause the apparatuses to carry out functionalities according to any of the embodiments with respect to FIGS. 1 to 11. The at least one processor 452, 502 may each be implemented with a separate digital signal processor provided with suitable software embedded on a computer readable medium, or with a separate logic circuit, such as an application specific integrated circuit (ASIC).

The apparatuses 400 and 500 may further comprise radio interface components 456 and 506 providing the apparatus 400, 500, respectively, with radio communication capabilities with the radio access network. The radio interfaces 456 and 506 may be used to perform communication capabilities between the apparatuses 400 and 500. The radio interfaces 456 and 506 may be used to communicate data related to the measured EMF, to location estimation, etc.

User interfaces 458 and 508 may be used in operating the measuring device 400 and the database entity 500 by a user. The user interfaces 458, 508 may each comprise buttons, a keyboard, means for receiving voice commands, such as microphone, touch buttons, slide buttons, etc.

The apparatus 400 may comprise the terminal device of a cellular communication system, e.g. a computer (PC), a laptop, a tabloid computer, a cellular phone, a communicator, a smart phone, a palm computer, or any other mobile communication apparatus. In another embodiment, the apparatus is comprised in such a terminal device, e.g. the apparatus may comprise a circuitry, e.g. a chip, a processor, a micro controller, or a combination of such circuitries in the terminal device and cause the terminal device to carry out the above-described functionalities. Further, the apparatus 400 may be or comprise a module (to be attached to the terminal device) providing connectivity, such as a plug-in unit, an "USB dongle", or any other kind of unit. The unit may be installed either inside the terminal device or attached to the terminal device with a connector or even wirelessly. In an embodiment, the apparatus 400 is or is comprised in a mobile device.

As said, the apparatus 400, such as the mobile device, may comprise the at least one processor 452. The at least one processor 452 may comprise an EMF measurement circuitry for performing EMF measurements with the help of a magnetometer 470. An inertial measurement circuitry 462 may be for performing inertial measurements with the help of an IMU 472 or an odometer 474, for example. A calibration & correction circuitry 464 may be responsible of performing a calibration process of a magnetometer 470 and/or IMU 472, and/or correcting the acquired information from the magnetometer 470/IMU 472, for example.

The magnetometer 470 may be used to measure the EMF vector. There may be various other sensors or functional entities comprised in the PD 400. These may include an inertial measurement unit (IMU) 472, the odometer 474, a low range communication unit 476 for detecting the presence of a proximity communication signal, at least one camera 478, for example. A skilled person understood that these may be of use when performing the embodiments as described earlier. For example, the IMU 472 may comprise for example acceleration sensor and a gyroscope, for example. The at least one camera 478 may be used to capture images for the purposes of location tracking on the basis of camera images and an image database, for example, or for building an image database of a building on the basis of captured images. The apparatus 400 may further comprise output unit 480 comprising, e.g. a display or a speaker, for outputting information to the person carrying the mobile device 400. An RF signal receiver 482 may be for reception of satellite signals or other wireless RF signals, such as WiFi signals.

The memory 454 may comprise space 490 for storing the set of EMF measurement results 320 and space 492 for storing the inertial measurement results 330. Further, there may be space for a plurality of other data, such as space for storing the list of items of interest, etc.

The apparatus 500 of FIG. 13, serving as the database entity, may locate in the network. The apparatus 500 may be a server computer, for example. In this case, the mobile devices 400 may need to send their measured EMF measurements results 320 and motion data sets 330 to the database entity 500 via a wireless network. For the transmission the mobile devices may apply WiFi, Bluetooth, cellular communication network, for example. Yet, in one embodiment, the database entity 500 may be located inside a mobile device 400. In such case, the transfer of the measured EMF measurement results may take place internally inside the mobile device 400.

The apparatus 500, such as the database entity, may comprise the at least one processor 502. The at least one processor 502 may comprise several circuitries. As an example, an indoor navigation circuitry 510 for performing indoor navigation on the basis of the received set of Earth's magnetic field measurement results and the EMF map. The circuitry 510 may apply for example multi-hypothesis location estimator/tracker/filter, for example.

A SLAM control circuitry 512 may be for performing EMF based SLAM according to any of the embodiments explained. For example, the SLAM circuitry 512 may be for building the EMF map and/or the floor plan 800 of the building on the basis of the data sets 320 and 330. The memory 504 may comprise space reserved for building the EMF map 540. The memory 504 may also comprise space for building a floor plan 800 of the building 100. The memory 504 may further comprise space for building or updating any other type of map, such as radio map (e.g. the WiFi map).

A calibration & correction circuitry 514 may be responsible of causing or co-operating in a calibration process of a magnetometer 470 or IMU 472 of the mobile device 400 and/or correcting the acquired information from the mobile device 400, for example.

As may be understood by a skilled person from the description of the embodiments throughout the application and from FIGS. 12 and 13, the embodiments may be performed in the portable device 400, in the database entity 500, or the execution of embodiments may be shared among the portable device 400 and the database entity 500.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in an entity, a cellular network device, or another network device.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described may also be carried out in the form of a computer process defined by a computer program. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. Coding of software for carrying out the embodiments as shown and described is well within the scope of a person of ordinary skill in the art.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An apparatus, comprising:
at least one processor and at least one memory including a computer program code, wherein the at least one memory and the computer program code are configured, with the at least one processor, to cause the apparatus to perform operations comprising:

acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models; and clustering the plurality of the mobile devices geographically based on the generated EMF fingerprints.

2. The apparatus of claim 1, wherein the apparatus is further caused to perform operations comprising:
generating an EMF map of the building based on the locations of the routes with respect to each other and the EMF fingerprints.

3. The apparatus of claim 1, wherein the apparatus is further caused to perform operations comprising:
generating a floor plan of the building based on the locations of the routes with respect to each other.

4. The apparatus of claim 1, wherein the apparatus is further caused to perform operations comprising:
determining a correction measure for at least one mobile device, wherein the correction measure of the mobile device indicates how to adjust the data sets related to that mobile device; and
causing an adjustment of the data sets related to the mobile device based on the corresponding correction measure.

5. The apparatus of claim 4, wherein the correction measure for a given mobile device is based on at least one of the following: known bias of the mobile device, software applications being run in the mobile device, type and/or model of the mobile device.

6. The apparatus of claim 1, wherein the apparatus is further caused to perform operations comprising:
determining a reliability measure for each mobile device, wherein the reliability measure of a mobile device indicates whether the data sets received from that mobile device are reliable or not; and
weighing the received data sets from the mobile devices based on the corresponding reliability measures.

7. The apparatus of claim 1, wherein the apparatus initially stores at least part of the EMF map of the building, and the apparatus is further caused to perform operations comprising:
updating the EMF map and/or enlarging the coverage area of the EMF map based on the acquired EMF data sets and the route models.

8. An apparatus, comprising:
at least one processor and at least one memory including a computer program code, wherein the at least one memory and the computer program code are configured, with the at least one processor, to cause the apparatus to perform operations comprising:
acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models;

acquiring location dependent data of the mobile devices;

limiting a geographical location of a given mobile device based on the location dependent data related to that mobile device, thereby clustering the data sets from the plurality of mobile devices geographically; and applying the clustering when determining the locations of the routes with respect to each other.

9. The apparatus of claim 8, wherein the location dependent data comprises data related to at least one of the following: measured WiFi radio frequency signal, identifier of an WiFi or Bluetooth access point, measured satellite radio frequency signal, measured air pressure, measured Bluetooth radio frequency signal, measured cellular radio frequency signal, identifier of the mobile device, measured direction of the Earth magnetic field, audio signal, video signal, image(s), ambient light, humidity, location-dependent event.

10. An apparatus, comprising:
at least one processor and at least one memory including a computer program code, wherein the at least one memory and the computer program code are configured, with the at least one processor, to cause the apparatus to perform operations comprising:
acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models;

detecting that a single EMF fingerprint corresponding to one mobile device comprises a similar EMF sequence at two parts of the route model; and determining, based on the detection, that a route loop closure occurs along that part of the route model.

11. The apparatus of claim 10, wherein the apparatus is further caused to perform operations comprising:
detecting that the route model, estimated based on the motion data set acquired from that mobile device, does not coincide at the part of the route loop closure;
determining that the inertial sensors of that mobile device have drifted and thereby cause the route model not to coincide; and causing a correction of the motion data set related to that mobile device, thereby reshaping the route model of that mobile device.

12. An apparatus, comprising:

at least one processor and at least one memory including a computer program code, wherein the at least one memory and the computer program code are configured, with the at least one processor, to cause the apparatus to perform operations comprising:

acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models;

detecting that at least part of a first EMF fingerprint matches, according to a predetermined likelihood, with at least part of a second EMF fingerprint;

determining, based on the detection, that the two routes coincide at least partly; and determining that the points of the route models before and after the matching part of the first and the second EMF fingerprints comprise intersections in the building.

13. An apparatus, comprising:

at least one processor and at least one memory including a computer program code, wherein the at least one memory and the computer program code are configured, with the at least one processor, to cause the apparatus to perform operations comprising:

acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models;

acquiring indications of items of interest from the mobile devices;

associating each item of interest to a corresponding point of a corresponding route model; and determining the locations of the routes with respect to each other further based on the indicated items of interests.

14. An apparatus, comprising:

at least one processor and at least one memory storing a floor plan of a building and including a computer program code, wherein the at least one memory and the computer program code are configured, with the at least one processor, to cause the apparatus to perform operations comprising:

acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models; and placing the routes in the floor plan based on the route models and the stored floor plan of the building.

15. The apparatus of claim 14, wherein the apparatus is further caused to perform operations comprising:

detecting that the route model, estimated based on the motion data set acquired from that mobile device, does not fit correctly to any route on the floor plan;

estimating the most probably traveled route of the floor plan based on the motion data set acquired from that mobile device and consider that route as the traveled route;

determining that the inertial sensors of that mobile device have drifted and thereby cause the route model not to match with the most probably traveled route; and causing a correction of the motion data set related to that mobile device, thereby reshaping the route model of that mobile device.

16. The apparatus of claim 14, wherein the apparatus is further caused to perform operations comprising:

detecting that the route model, estimated based on the motion data set acquired from that mobile device, does not fit correctly to any route on the floor plan;

determining that the stored floor plan is not up-to-date; and updating the floor plan based on the route model.

17. An apparatus, comprising:

at least one processor and at least one memory including a computer program code, wherein the at least one memory and the computer program code are configured, with the at least one processor, to cause the apparatus to perform operations comprising:

acquiring indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with the route models;

determining locations of the routes with respect to each other based on at least one of the following: the EMF fingerprints and the route models;

acquiring radio frequency based measurement results from the mobile device;
associating the radio frequency based measurement results with corresponding points of the route models; and
generating and/or updating a radio frequency map of the building based on the acquired radio frequency based measurement results and the associated corresponding points of the route models.

18. A method, comprising:
acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;
estimating route models of the traveled routes based on the motion data sets;
generating EMF fingerprints for the traveled routes by associating the acquired EMF data sets with corresponding points of the route models;
determining locations of the routes with respect to each other based on at least one of the following: the EMF fingerprints and the route models;
acquiring location dependent data of the mobile devices;
limiting a geographical location of a given mobile device based on the location dependent data related to that mobile device, thereby clustering the data sets from the plurality of mobile devices geographically; and
applying the clustering when determining the locations of the routes with respect to each other.

19. A method, comprising:
acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;
estimating route models of the traveled routes based on the motion data sets;
generating EMF fingerprints for the traveled routes by associating the acquired EMF data sets with corresponding points of the route models;
determining locations of the routes with respect to each other based on at least one of the following: the EMF fingerprints and the route models; and
clustering the plurality of the mobile devices geographically based on the generated EMF fingerprints.

20. A method, comprising:
acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;
estimating route models of the traveled routes based on the motion data sets;
generating EMF fingerprints for the traveled routes by associating the acquired EMF data sets with corresponding points of the route models;
determining locations of the routes with respect to each other based on at least one of the following: the EMF fingerprints and the route models;
detecting that a single EMF fingerprint corresponding to one mobile device comprises a similar EMF sequence at two parts of the route model; and
determining, based on the detection, that a route loop closure occurs along that part of the route model.

21. A method, comprising:
acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;
estimating route models of the traveled routes based on the motion data sets;
generating EMF fingerprints for the traveled routes by associating the acquired EMF data sets with corresponding points of the route models;
determining locations of the routes with respect to each other based on at least one of the following: the EMF fingerprints and the route models;
detecting that at least part of a first EMF fingerprint matches, according to a predetermined likelihood, with at least part of a second EMF fingerprint;
determining, based on the detection, that the two routes coincide at least partly; and
determining that the points of the route models before and after the matching part of the first and the second EMF fingerprints comprise intersections in the building.

22. A method, comprising:
acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;
estimating route models of the traveled routes based on the motion data sets;
generating EMF fingerprints for the traveled routes by associating the acquired EMF data sets with corresponding points of the route models;
determining locations of the routes with respect to each other based on at least one of the following: the EMF fingerprints and the route models;
acquiring indications of items of interest from the mobile devices;
associating each item of interest to a corresponding point of a corresponding route model; and
determining the locations of the routes with respect to each other further based on the indicated items of interests.

23. A method, comprising:
acquiring, by an apparatus storing a floor plan of a building, indoor non-labeled Earth's magnetic field, EMF, data sets representing at least one of magnitude and direction of the EMF in a building from a plurality of mobile devices, wherein routes corresponding to the non-labeled EMF data sets in the building are unknown;
acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models; and placing the routes in the floor plan based on the route models and the stored floor plan of the building.

24. A method, comprising:

acquiring, by an apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

acquiring radio frequency based measurement results from the mobile device;

associating the radio frequency based measurement results with corresponding points of the route models; and generating and/or updating a radio frequency map of the building based on the acquired radio frequency based measurement results and the associated corresponding points of the route models.

25. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

acquiring location dependent data of the mobile devices;

limiting a geographical location of a given mobile device based on the location dependent data related to that mobile device, thereby clustering the data sets from the plurality of mobile devices geographically; and applying the clustering when determining the locations of the routes with respect to each other.

26. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models; and clustering the plurality of the mobile devices geographically based on the generated EMF fingerprints.

27. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

detecting that a single EMF fingerprint corresponding to one mobile device comprises a similar EMF sequence at two parts of the route model; and determining, based on the detection, that a route loop closure occurs along that part of the route model.

28. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

detecting that at least part of a first EMF fingerprint matches, according to a predetermined likelihood, with at least part of a second EMF fingerprint;

determining, based on the detection, that the two routes coincide at least partly; and determining that the points of the route models before and after the matching part of the first and the second EMF fingerprints comprise intersections in the building.

29. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

acquiring indications of items of interest from the mobile devices;

associating each item of interest to a corresponding point of a corresponding route model; and determining the locations of the routes with respect to each other further based on the indicated items of interests.

30. A computer program product embodied on a non-transitory distribution medium readable by a computer and comprising program instructions which, when loaded into an apparatus, execute a method comprising:

acquiring, by the apparatus storing a floor plan of a building, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models; and placing the routes in the floor plan based on the route models and the stored floor plan of the building.

31. A computer program product embodied on a non-transitory distribution medium readable by a computer and comprising program instructions which, when loaded into an apparatus, execute a method comprising:

acquiring, by the apparatus, indoor non-labeled Earth's magnetic field, EMF, data sets representing at least one of magnitude and direction of the EMF in a building from a plurality of mobile devices, wherein routes corresponding to the non-labeled EMF data sets in the building are unknown;

acquiring motion data sets from the plurality of mobile devices;

estimating route models of the traveled routes based on the motion data sets;

generating EMF fingerprints for the traveled routes by associating the acquired EMF data sets with corresponding points of the route models;

determining locations of the routes with respect to each other based on at least one of the following: the EMF fingerprints and the route models;

acquiring radio frequency based measurement results from the mobile device;

associating the radio frequency based measurement results with corresponding points of the route models; and generating and/or updating a radio frequency map of the building based on the acquired radio frequency based measurement results and the associated corresponding points of the route models.

* * * * *